United States Patent [19]
Bishop et al.

[11] Patent Number: 6,052,300
[45] Date of Patent: Apr. 18, 2000

[54] DC-AC CONVERTER CIRCUIT USING RESONATING MULTI-LAYER PIEZOELECTRIC TRANSFORMER

[75] Inventors: Richard Patten Bishop, Fairfax Station; Clark Davis Boyd, Hampton, both of Va.

[73] Assignee: Face International Corporation, Norfolk, Va.

[21] Appl. No.: 09/318,967

[22] Filed: May 26, 1999

Related U.S. Application Data

[60] Provisional application No. 60/107,594, Nov. 9, 1998.

[51] Int. Cl.[7] .......................... H02M 7/537; H01L 41/08
[52] U.S. Cl. ............................................ 363/131; 310/316
[58] Field of Search ................... 363/131, 18, 19, 363/97; 323/299; 310/359, 316

[56] References Cited

U.S. PATENT DOCUMENTS

| | | | |
|---|---|---|---|
| 4,554,477 | 11/1985 | Ratcliff | 310/316 |
| 5,329,200 | 7/1994 | Zaitsu | 310/316 |
| 5,341,061 | 8/1994 | Zaitsu | 310/316 |
| 5,654,605 | 8/1997 | Kawashima | 310/316 |
| 5,739,679 | 4/1998 | Takehara et al. | 323/299 |

*Primary Examiner*—Peter S. Wong
*Assistant Examiner*—Rajnikant B. Patel
*Attorney, Agent, or Firm*—Stephen E. Clark; David J. Bolduc

[57] ABSTRACT

DC-AC voltage transformation circuits are provided which use a resonating piezoelectric transformer along with complementary circuit components, to efficiently convert a DC first voltage to a transformer-output AC second voltage. In the preferred embodiment of the invention, A High Displacement Piezoelectric (HDP) transformer achieves sufficiently high voltage output to "cold fire" a gas discharge lamp. The disclosed circuit may be modified using conventional electrical sub-circuitry to pre-heat the cathodes of the lamp. The transformer circuit may be a "self resonating" circuit which relies on an initial pulse from turning on the DC power supply to cause the transformer to begin resonating. In a modified voltage converter circuit, the circuit is not "self resonating" and instead has a phase shift oscillator sub-circuit that provides small pulse signals to start the transformer resonating when the circuit is initially turned on.

2 Claims, 10 Drawing Sheets

DC-AC CONVERTER CIRCUIT USING RESONATING MULTI-LAYER PIEZOELECTRIC TRANSFORMER

This application claims the benefit of U.S. Provisional Application Ser. No. 60/107,594 filed on Nov. 9, 1998.

BACKGROUND OF THE INVENTION

1. Field of Invention

This invention relates to voltage conversion circuits. More particularly, this invention relates to DC-AC voltage transformation circuits wherein a resonating piezoelectric transformer is used, along with complementary circuit components, to efficiently convert a DC first voltage to a transformer-output AC second voltage.

2. Description of Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce.

To remedy this and many other problems of the wire-wound transformer, piezoelectric transformers utilizing the piezoelectric effect have been provided in the prior art. In contrast to the general electromagnetic transformer, the piezoelectric ceramic transformer has a number of advantages. The size of a piezoelectric transformer can be made smaller than electromagnetic transformers of comparable transformation ratio. Piezoelectric transformers can be made nonflammable, and they produce no electromagnetically induced noise.

The ceramic body employed in prior piezoelectric transformers take various forms and configurations, including rings, flat slabs and the like. A typical example of a prior piezoelectric transformer is illustrated in FIG. 1. This type of piezoelectric transformer is commonly referred to as a "Rosen-type" piezoelectric transformer. The basic Rosen-type piezoelectric transformer was disclosed in U.S. Pat. No. 2,830,274 to Rosen, and numerous variations of this basic apparatus are well known in the prior art. The typical Rosen-type piezoelectric transformer comprises a flat ceramic slab 210 which is appreciably longer than it is wide and substantially wider than thick. As shown in FIG. 11, a piezoelectric body 210 is employed having some portions polarized differently from others. In the case of FIG. 11, the piezoelectric body 210 is in the form of a flat slab that is considerably wider than it is thick, and having greater length than width. A substantial portion of the slab 210, the portion 212 to the right of the center of the slab is polarized longitudinally, whereas the remainder of the slab is polarized transversely to the plane of the face of the slab. In this case the remainder of the slab is actually divided into two portions, one portion 214 being polarized transversely in one direction, and the remainder of the left half of the slab, the portion 216 also being polarized transversely but in the direction opposite to the direction of polarization in the portion 214.

In order that electrical voltages may be related to mechanical stress in the slab 210, electrodes are provided. If desired, there may be a common electrode 218, shown as grounded. For the primary connection and for relating voltage at opposite faces of the transversely polarized portion 214 of the slab 210, there is an electrode 220 opposite the common electrode 218. For relating voltages to stress generated in the longitudinal direction of the slab 210, there is a secondary or high-voltage electrode 222 cooperating with the common electrode 218. The electrode 222 is shown as connected to a terminal 224 of an output load 226 grounded at its opposite end.

In the arrangement illustrated in FIG. 1, a voltage applied between the electrodes 218 and 220 is stepped up to a high voltage between the electrodes 218 and 222 for supplying the load 226 at a much higher voltage than that applied between the electrodes 218 and 220.

An inherent problem of such prior piezoelectric transformers that they have relatively low power transmission capacity. This disadvantage of prior piezoelectric transformers relates to the fact that little or no mechanical advantage is realized between the driver portion of the device and the driven portion of the device, since each is intrinsically a portion of the same electroactive member. This inherently restricts the mechanical energy transmission capability of the device, which, in turn, inherently restricts the electrical power handling capacity of such devices. Additionally, even under resonant conditions, because the piezoelectric voltage transmission function of Rosen-type piezoelectric transformers is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

In addition, because the typical prior piezoelectric transformer accomplishes the piezoelectric voltage transmission function by proportionate changes in the x-y and y-z surface areas (or, in certain embodiments, changes in the x-y and x'-y' surface areas) of the piezoelectric member, it is generally necessary to alternately apply positive and negative voltages across opposing faces of the "driver" portion of the member in order to "push" and "pull", respectively, the member into the desired shape. Even under resonant conditions, prior electrical circuits that incorporate such prior piezoelectric transformers are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability. Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Because the power transmission capacity of such prior piezoelectric transformers is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer; and the resulting power handling capacity of the "stack" is still limited to the arithmetic sum of the power handling capacity of the individual elements.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

It would also be desirable to provide a piezoelectric transformer that, at its natural frequency, oscillates with greater momentum than is achievable with comparably sized prior piezoelectric transformers.

U.S. patent application Ser. No. 08/864,029 filed May 27, 1997, (now U.S. Pat. No. 5,834,882) which is included by reference thereto, describes a multi-layered, laminated, piezoelectric transformer that has demonstrated an ability to convert a primary or input voltage to a higher secondary or output voltage through the application of voltage to a first polarized piezoelectric ceramic wafer. The application of voltage to the first piezoelectric wafer generates an extensional stress in that wafer that is mechanically transmitted to a second tightly adhered polarized piezoelectric ceramic wafer, which undergoes a similar and proportional extensional stress and thereby produces an output voltage. The ratio of the first voltage to the second voltage is a function of the piezoelectric properties of the two wafers, the size and geometry of the two wafers and the size and elasticity of the ceramic wafers and other adhesive and pre-stress layers as well as the poling characteristics of the ceramic wafers utilized in the devices described in the above-referenced U.S. Patent Application. Similarly, the resonant frequency of a particular design of such a device will be determined by the same parameters.

Copending U.S. patent application Ser. No. 60/092,284 filed Jul. 10, 1998, which is included by reference thereto, describes a method of manufacturing a piezoelectric transformer by ultrasonically welding together adjacent layers of the transformer.

Copending U.S. patent application Ser. No. 09/177,767 filed Oct. 23, 1998, which is included by reference thereto, describes a method of manufacturing a piezoelectric transformer by co-firing of multiple ceramic layers.

Copending U.S. patent application Ser. No. 09/118,136 filed Jul. 16, 1998, which is included by reference thereto, describes a positive feedback resonant transducer circuit. In the '136 application an output from a step-up transformer is fed back as input to the transformer to produce a twice-stepped-up output; the twice-stepped-up output is fed back as input to the transformer to produce a thrice-stepped-up output. This feedback cycle is repeated (and supplemented by "make-up" power) to generate a multi-stepped up transformer output voltage.

Copending U.S. patent application Ser. No. 60/103,528 filed Oct. 8, 1998, which is included by reference thereto, describes a piezoelectric fluorescent lamp excitation circuit comprising a multi-layer piezoelectric transformer.

It is well known to combine transformers with other circuit elements in the prior art to provide means for converting an input signal of one character (typically at a first voltage) to an output signal of another character (typically at a second voltage). Such "voltage converter" circuits have many applications. Examples of uses for such voltage converter circuits include the conversion of standard 110 VAC house electrical power to DC electrical power at a different voltage, and "inverter" circuits that convert DC electrical signals to AC signals. Certain ballast circuits for gas discharge lamps, such as a fluorescent lamp ballasts, are examples of the latter application.

For reasons discussed above, piezoelectric transformers offer many advantages over prior wire-wound transformers and, therefore, it is desirable to use piezoelectric transformers in voltage converter circuit applications. Prior voltage converter circuits comprising piezoelectric transformer devices are typically of relatively low efficiency and require a relatively high number of circuit components. When used to convert low voltage DC input signals to high voltage AC output signals (such as in gas discharge lamp ballasts), many such prior converter circuits typically rely on the coordinated operation of a plurality of switching transistors (or equivalent electronic components) to alternately apply positive and negative voltage to the transformer, in order to "push" and "pull", respectively, the driver portion of the piezoelectric transformer.

It would be desirable to provide a voltage converter circuit that is highly efficient, that uses fewer circuit components than prior voltage converter circuits that perform comparable signal transformation functions, and that is relatively less expensive to manufacture than prior voltage converter circuits that perform comparable signal transformation functions.

It would also be desirable to provide a solid state voltage converter circuit that has high power transmission capabilities.

It would still further be desirable to be able to provide such a voltage converter circuit to efficiently power and control a gas discharge lamp.

It would still further be desirable to provide a solid state, high power, high efficiency voltage converter circuit in which the transformer output portion of the circuit is electrically isolated from the transformer input portion of the circuit.

SUMMARY OF THE INVENTION

According to the present invention, there is provided an electric circuit that incorporates a piezoelectric transformer preferably operating at its natural (i.e. "resonant") frequency to convert a transformer input signal of a first character (i.e. voltage, frequency and current) to a transformer output signal of a second character (i.e. voltage, frequency and current). The disclosed circuit, which may be powered by either a DC source or by a rectified AC source, efficiently accomplishes the described signal conversion by subjecting the "driver" section of a piezoelectric transformer to a voltage of a first polarity, which in turn causes the piezoelectric transformer to deform, which in turn causes the "driven" section of the piezoelectric transformer to deform, and which in turn generates an output voltage at the driven section of the transformer. During steady state operation of the circuit, electrical energy applied to the driver section of the transformer is either (1) piezoelectrically converted to electrical energy at the output side of the transformer, (2) dissipated as heat by the transformer, or (3) stored as mechanical energy by the transformer. In the present invention, a circuit is provided in which the portion of energy that is stored as mechanical energy by the transformer during one half-cycle of operation of the circuit is nearly entirely converted back into useable electrical energy (at a voltage of an opposite polarity) during the second half-cycle of operation of the circuit. Thus a resonant circuit is provided, together with preferably a single switching transistor, for oscillating the piezoelectric transformer at its resonant frequency while minimizing energy losses (i.e. heat dissipation) in the voltage converter circuit.

In a preferred embodiment of the invention, which comprises a multi-layer piezoelectric transformer that is capable of achieving high mechanical momentum (and, therefore, is capable of high energy storage and transmission), a voltage converter circuit is provided to power and control operation of a gas discharge lamp.

Accordingly, it is an object the present invention to provide a piezoelectric transformer design that has a higher power transmission capacity than similarly sized prior piezoelectric transformers.

It is another object of the present invention to provide a piezoelectric transformer that is smaller than prior piezoelectric transformers that have similar power transmission capacities.

It is another object of the present invention to provide a piezoelectric transformer in which the "driver" portion of the device and the "driven" portion of the device are not the same electro-active element.

It is another object of the present invention to provide a piezoelectric transformer that develops a substantial mechanical advantage between the driver portion of the device and the driven portion of the device.

It is another object of the present invention to provide a piezoelectric transformer that, at its natural frequency, oscillates with greater momentum than is achievable in comparably sized prior piezoelectric transformers.

It is another object of the present invention to provide a voltage converter circuit that is highly efficient, that uses fewer circuit components than prior voltage converter circuits that perform comparable signal transformation functions, and that is relatively less expensive to manufacture than prior voltage converter circuits that perform comparable signal transformation functions.

It is another object of the present invention to provide a solid state voltage converter circuit that has high power transmission capabilities.

It is an object to provide a modification of the a voltage converter circuit of the character described in which the transformer output portion of the circuit is electrically isolated from the transformer input portion of the circuit.

It is object of another modification of the present invention to provide a voltage converter circuit to efficiently power and control gas discharge lamps.

It is another object to provide such a modification of the present invention in which, during steady state operation of the circuit, a substantial portion of the electrical energy that is applied to the driver section of the transformer during one half-cycle of operation may be mechanically stored in the transformer and subsequently nearly entirely converted back into useable electrical energy (at a voltage of an opposite polarity) during the second half-cycle of operation of the circuit.

It is also an object of a modification of this invention to provide a gas discharge lamp power-supply and control circuit of the character described that uses a transformer device having inherent fundamental characteristics that are more conducive to the device being used as a step-up transformer than the characteristics of conventional magnetic-coil transformers.

It is also an object of a modification of this invention to provide a gas discharge lamp power-supply and control circuit of the character described that uses a multi-layer transformer device of the character described with inherent fundamental characteristics that are more conducive to the device being used as a step-up transformer than the characteristics of conventional Rosen-type piezoelectric transformers.

It is also an object of a modification of this invention to provide a gas discharge lamp power-supply and control circuit of the character described that uses a step-up transformer that can be inherently made smaller in all dimensions than conventional magnetic transformers.

It is another object of a modification of this invention to provide a gas discharge lamp power-supply and control circuit of the character described that can be made smaller than conventional circuits using magnetic step-up transformers or prior piezoelectric transformers.

It is another object of a modification of this invention to provide a gas discharge lamp power-supply and control circuit of the character described having a simpler construction than conventional, magnetic or piezoelectric, power-supply circuits.

It is another object of a modification of this invention to provide a gas discharge lamp power-supply and control circuit of the character described using a multi-layer transformer device of the character described that does not require a sinusoidal input in order to generate a high-frequency, high-voltage AC output.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

Figure 1:
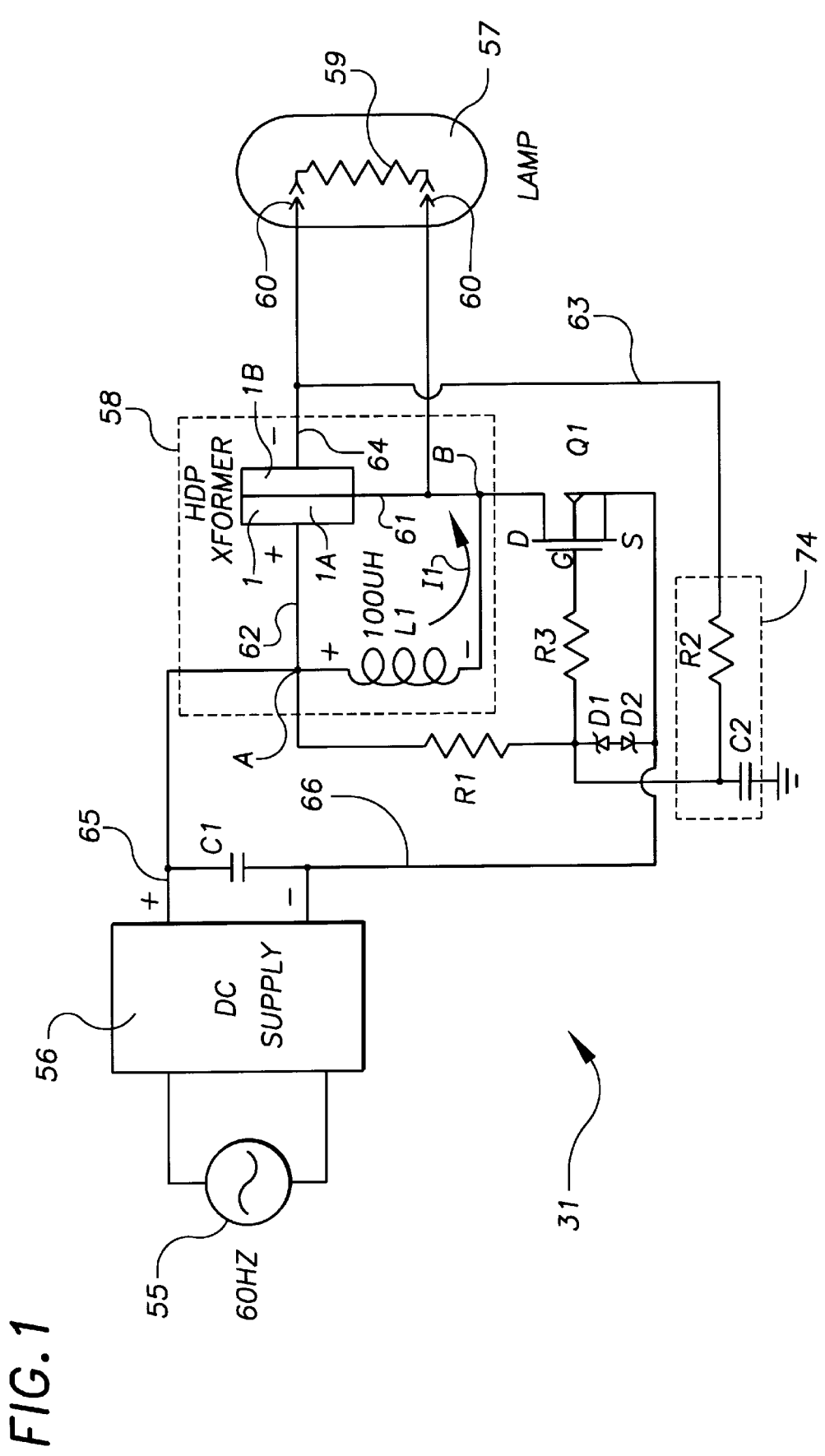
FIG. 1 a schematic diagram of one exemplary embodiment of a voltage converter circuit that incorporates principles of the present invention.

As will be described more fully herein below, according to the preferred embodiment of the present invention, there is provided an electric circuit that incorporates a piezoelectric transformer 1 operating at its natural (i.e. "resonant") frequency to convert a transformer input signal 62 of a first character (i.e. voltage, frequency and current) to a transformer output signal 64 of a second character (i.e. voltage, frequency and current). The described circuit, which may be powered by a DC source, but preferably by a rectified AC source 55, efficiently accomplishes the described signal conversion by subjecting the driver (or, "input") section 1A of the piezoelectric transformer to a voltage of a first polarity, which in turn causes the piezoelectric transformer 1 to deform, which in turn causes the driven (or, "output") section 1B of the piezoelectric transformer to deform, and which, in turn, generates an output voltage at the driven section 1B of the transformer. During steady state operation of the circuit, electrical energy applied to the driver section 1A of the transformer is (a) piezoelectrically converted to electrical energy at the output side of the transformer, (b) dissipated as heat by the transformer, and/or (c) stored as mechanical energy by the transformer 1. In the present invention, a circuit is provided in which the portion of energy that is stored as mechanical energy by the transformer 1 during one half-cycle of operation of the circuit, is nearly entirely converted back into useable electrical energy (at a voltage of an opposite polarity) during the second half-cycle of operation of the circuit, thus providing an exceptionally efficient voltage converter circuit. As will be more fully described herein below, and as illustrated in FIG. 1, a parallel resonant circuit 58 is provided, together with preferably a single switching transistor Q1, for oscillating the piezoelectric transformer 1 at its resonant frequency while minimizing energy losses in the voltage converter circuit.

In a preferred embodiment of the invention, which comprises a multi-layer piezoelectric transformer 1 that is capable of achieving high mechanical momentum (and, therefore, is capable of high energy storage and transmission), a voltage converter circuit provides power-supply and control for a gas discharge lamp 57. It will be understood from the instant disclosure that a circuit constructed and operated in accordance with the principles of the present invention can be most advantageously practiced by using a multi-layer piezoelectric transformer 1 that is capable of achieving high mechanical momentum (and, therefore, is capable of high energy storage and transmission). Accordingly, a description of the construction and characteristics of the preferred high performance multi-layer piezoelectric transformer is given below. However, it should be understood that other, conventional, piezoelectric transformers may be used in modified embodiments of the invention to advantageously optimize the operational (i.e. voltage conversion and power transmission) performance of such conventional transformers.

An application of the preferred embodiment of the invention is described below wherein the voltage converter circuit is used to power and control the operation of a gas discharge lamp, particularly a fluorescent lamp. However, it should be understood that the voltage conversion circuit of the present invention may be advantageously used for many applications, and the scope of the invention, therefore, should not be limited by the nature or description of the "load" that may be applied to the transformer's output.

High Deformation Piezoelectric Transformer

Figure 7:
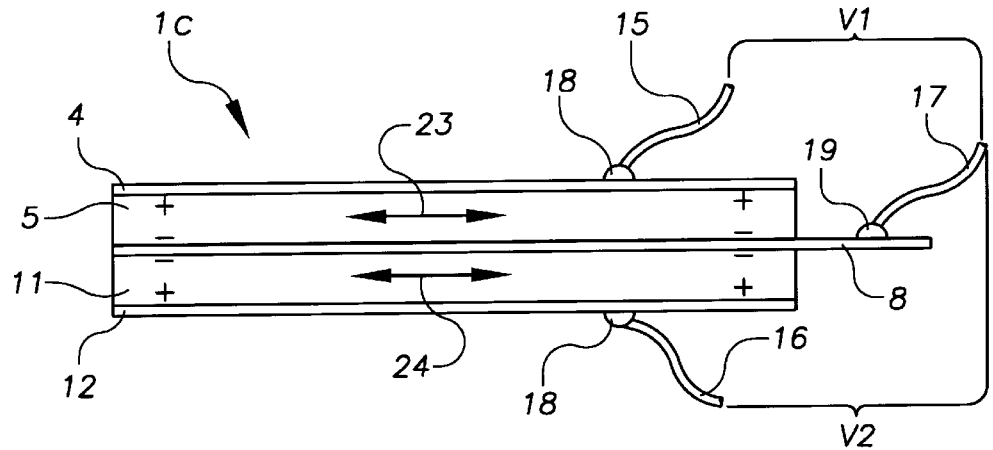
FIG. 7 is an elevation view showing a modified multi-layer piezoelectric transformer that may be used in a voltage converter circuit constructed in accordance with the principles of the present invention.

Referring to FIG. 7: A high deformation piezoelectric (HDP) transformer 1C comprises a first piezoelectric ceramic layer 5 and a second piezoelectric ceramic layer 11. First and second piezoelectric ceramic layers 5 and 11 comprise discrete members bonded to a substantially flat intermediate electrode 8. The composite structure has a longitudinal plane that is substantially parallel to the planes of interface between the intermediate electrode 8 and first and second ceramic layers 5 and 11. Opposite outboard surfaces of ceramic layers 5 and 11 are electroded 4 and 12, respectively, such as by electro-depositing or the like. Electrodes 4 and 12 substantially extend over the entire outboard opposing surfaces of ceramic layers 5 and 11. The ceramic layers 5 and 11 are each electrically polarized (substantially throughout their respective masses) in the same direction, namely perpendicular to the longitudinal plane of the composite structure. In other words, ceramic layer 5 is polarized between electrode 4 and electrode 8 such that when a first voltage V1 of a first polarity is applied between electrode 4 and electrode 8, ceramic layer 5 tends to elongate (as indicated by arrow 23) in a direction parallel to the longitudinal plane of the composite structure; and when a voltage V1 of a second first polarity is applied between electrode 4 and electrode 8, ceramic layer 5 tends to contract in a direction parallel to the longitudinal plane of the composite structure. Similarly, ceramic layer 11 is polarized between electrode 12 and electrode 8 such that when a second voltage V2 of a first polarity is applied between electrode 12 and electrode 8, ceramic layer 11 tends to elongate (as indicated by arrow 24) in a direction parallel to the longitudinal plane of the composite structure; and when a voltage V2 of a second first polarity is applied between electrode 12 and electrode 8, ceramic layer 11 tends to contract in a direction parallel to the longitudinal plane of the composite structure. As stated above, the direction electrical polarization of the ceramic layers 5 and 11 are parallel to each other (i.e. perpendicular to the longitudinal plane of the composite structure). It is preferable that polarization is oriented such that outboard-facing surfaces of the ceramic layers 5 and 11 are "positively" poled, while the facing interior surfaces of the ceramic layer 5 and 11 are negatively poled (as indicated by "+" and "−" signs, respectively, in FIG. 7).

As will be explained more fully herein below, in the preferred operation of the present invention one ceramic layer (e.g. 5) serves as a "driver" section that may longitudinally extend or contract upon application (across electrodes 4 and 8) of a first voltage, and the other ceramic layer (e.g. 11) serves as a "driven" section that may piezoelectrically generate a second voltage (across electrodes 8 and 12) when physically strained in a direction parallel the longitudinal plane of the composite structure.

Because ceramic layers 5 and 11 are constructed of piezoelectric materials, preferably PZT, that are transversely polarized, when a voltage V1 (of a first polarity) is applied across electrodes 4 and 8, ceramic layer 5 tends to piezoelectrically elongate as indicated by arrows 23 in a direction substantially parallel to the longitudinal plane of the composite structure. This elongation (23) of ceramic layer 5 is translated to ceramic layer 11, which begin to elongate in a like direction. This initially longitudinal elongation of ceramic layer 11 results in the piezoelectric generation of a second voltage V2 between electrodes 12 and 8. Similarly, when the polarity of the voltage V1 across electrodes 4 and 8 is reversed, a second voltage V2 of reverse polarity is developed between electrodes 12 and 8.

Figure 3:
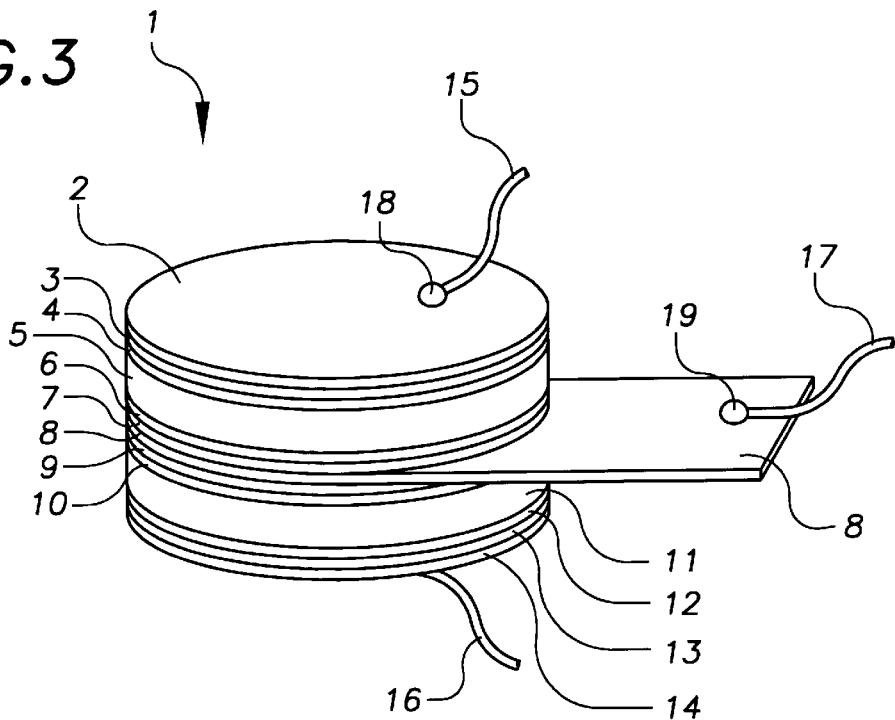
FIG. 3 is a perspective view of a multi-layer piezoelectric transformer that is preferably used in a voltage converter circuit constructed in accordance with the principles of the present invention.
Figure 4:
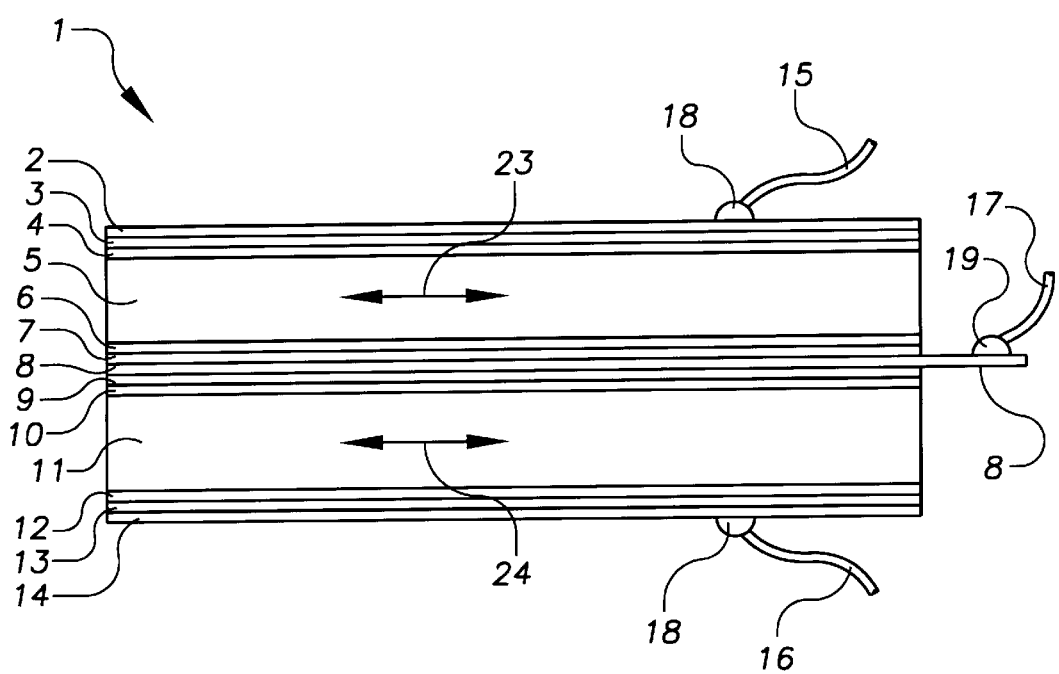
FIG. 4 is an elevation view showing the details of construction of the multi-layer piezoelectric transformer shown in FIG. 3.
Figure 5:
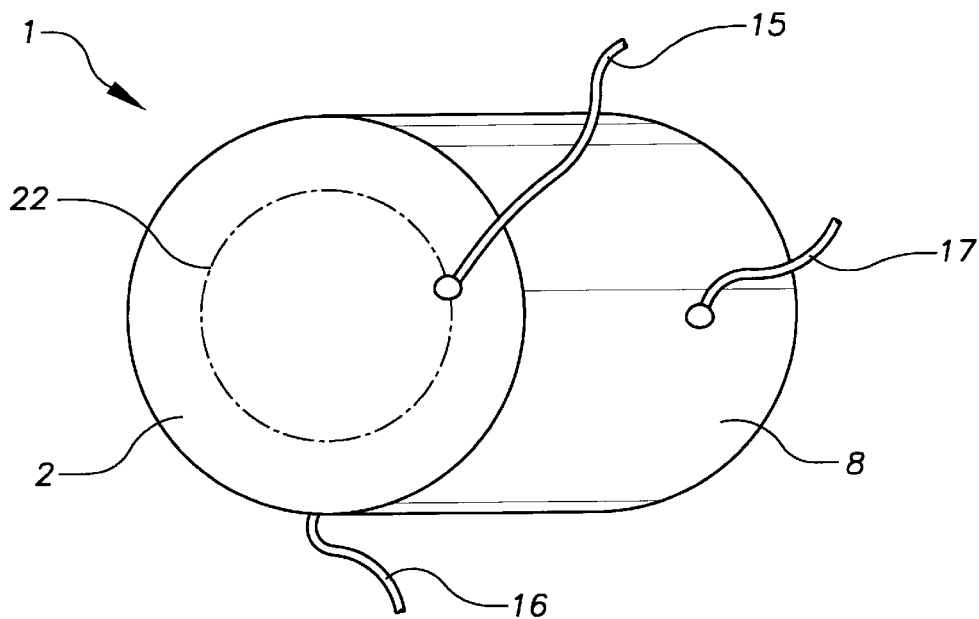
FIG. 5 is a is a plan view showing the top of the multi-layer piezoelectric transformer shown in FIG. 3.

Referring now to FIGS. 3–5: In the preferred embodiment of the invention, the HDP transformer 1 comprises a first piezoelectric ceramic layer 5 and a second piezoelectric ceramic layer 11. First and second piezoelectric ceramic layers 5 and 11 preferably comprise discrete members having electrodes 4 and 6, and 10 and 12, respectively, electro-deposited to their two opposing major faces. An adhesive 3, 7, 9 and 13, such as "Cibageigy AV118" as manufactured by Ciba Specialty Chemicals Corporation, N.A. of East Lansing, Mich., is used to bond a first exterior electrode 2 to electrode 4, an intermediate electrode 8 to first interior electrode 6, intermediate electrode 8 to a second interior electrode 10, and second exterior electrode 14 to electrode 12, respectively.

The composite structure (1) has a longitudinal plane that is substantially parallel to the planes of interface between the intermediate electrode 8 and first and second ceramic layers 5 and 11. Electrodes 4, 6, 9 and 12 substantially extend over the respective opposing surfaces of ceramic layers 5 and 11. The ceramic layers 5 and 11 are each electrically polarized (substantially throughout their respective masses) in the same direction, namely perpendicular to the longitudinal plane of the composite structure (1). In other words, ceramic layer 5 is polarized between electrode 4 and electrode 6 such that when a first voltage of a first polarity is applied between electrode 4 and electrode 6, ceramic layer 5 tends to elongate (as indicated by arrow 23) in a direction parallel to the longitudinal plane of the composite structure; and when a first voltage of a second polarity is applied between electrode 4 and electrode 6, ceramic layer 5 tends to contract in a direction parallel to the longitudinal plane of the composite structure. Similarly, ceramic layer 11 is polarized between electrode 12 and electrode 9 such that when a second voltage of a first polarity is applied between electrode 12 and electrode 9, ceramic layer 11 tends to elongate (as indicated by arrow 24) in a direction parallel to the longitudinal plane of the composite structure; and when a voltage of a second first polarity is applied between electrode 12 and electrode 9, ceramic layer 11 tends to contract in a direction parallel to the longitudinal plane of the composite structure. As will become apparent from the following disclosure, the above description of the polarization characteristics of the ceramic layers 5 and 12 is useful to illustrate that the two ceramic layers 5 and 12 are similarly polarized substantially across their entire cross-sections and that the lines of polarization of each ceramic layer 5 and 12 are parallel (i.e. perpendicular to the longitudinal plane of the composite structure).

However, as will be explained more fully herein below, in the preferred operation of the present invention voltage is not actually applied to the second ceramic layer (i.e. ceramic layer 11) to cause it to deform; rather it is mechanically deformed (i.e. by ceramic layer 5) and thus piezoelectrically generates a voltage potential across it opposing electrodes 10 and 12. Thus, in the preferred embodiment of the invention one ceramic layer (i.e. 5) serves as a "driver" section that may longitudinally extend or contract upon application (across electrodes 4 and 8) of a first voltage, and the other ceramic layer (e.g. 11) serves as a "driven" section that may piezoelectrically generate a second voltage (across electrodes 8 and 12) when physically strained in a direction parallel the longitudinal plane of the composite structure.

Because ceramic layers 5 and 11 are constructed of piezoelectric materials, preferably PZT, that are transversely polarized (i.e. perpendicular to the longitudinal plane of the composite structure), when a voltage (of a first polarity) is applied across electrodes 4 and 6, ceramic layer 5 tends to piezoelectrically elongate as indicated by arrows 23 in a direction substantially parallel to the longitudinal plane of the composite structure. This elongation (23) of ceramic layer 5 is translated to ceramic layer 11, which begins to elongate in a like direction. This initially longitudinal elongation of ceramic layer 11 results in the piezoelectric generation of a second voltage between electrodes 12 and 9. Similarly, when the polarity of the voltage across electrodes 4 and 8 is reversed, a second voltage of reverse polarity is developed between electrodes 12 and 8.

In the preferred embodiment of the invention the HDP transformer 1 is circular as viewed from above (as shown in FIG. 5) and of rectangular cross-section (as shown in FIG. 4). A circular shape of the HDP transformer 1 is desirable in step-up, narrow bandwidth transformer applications (such as when used in lamp ballast circuitry) because its symmetry reduces the introduction of interfering secondary and harmonic vibrations in the device. Asymmetric (i.e. non-circular, irregularly-shaped) geometry for the HDP transformer is desirable in broad bandwidth transformer applications because its asymmetry causes secondary and harmonic vibrations that reduce resonant frequency spikes.

Figure 6:
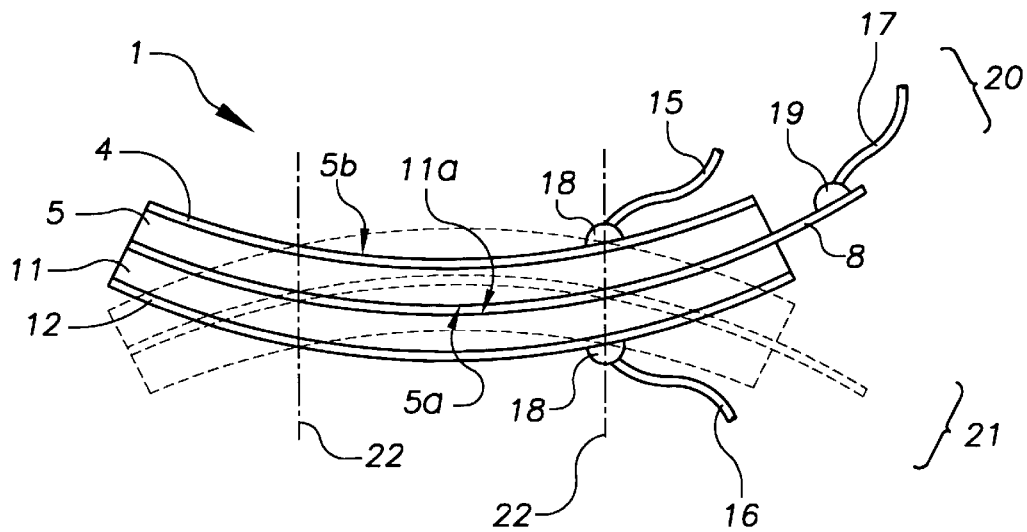
FIG. 6 is a schematic side view showing the flexing that the multi-layer piezoelectric transformer of FIG. 3 undergoes upon the application of voltages of opposite polarity.

Referring now to FIG. 6: FIG. 6 is a schematic side view showing the flexing that the HDP transformer 1 undergoes upon the application of a voltage. FIG. 6 schematically illustrates a HDP transformer 1 having first and second piezoelectric ceramic layers 5 and 11 bonded along a longitudinal plane to an intermediate electrode 8. Electrodes 4 and 12 are disposed on the outboard opposing surfaces of ceramic layers 5 and 11, respectively. Ceramic layers 5 and 11 are electrically polarized in the manner described above.

When a voltage of a first polarity is applied between exterior electrode 4 and interior electrode 8, ceramic layer 5 begins to elongate in a direction substantially parallel to the longitudinal plane of the composite structure 1. In the case where ceramic layer 5 comprises a substantially flat disc, such application of a voltage of a first polarity will be understood to cause to ceramic layer 5 to tend to radially expand. Such radial expansion of ceramic layer 5 is opposed by ceramic layer 11, to which it is (indirectly) bonded at their respective interior surfaces 5a and 11a. Such radial expansion of ceramic layer 5 causes tensile stress at the interior surface 11a of ceramic layer 11. This tensile stress at the interior surface 11a of ceramic layer 11 develops a moment in ceramic layer 11, which, in turn, causes ceramic layer 11 to curve as indicated by dashed lines (position 21) in FIG. 6. In addition, because the radial expansion of the interior surface 5a of the first ceramic is resisted by the compressive force of ceramic layer 11, while the radial expansion of the exterior surface 5b of ceramic layer 5 is not subjected to such a force, ceramic layer 5 tends further to curve as indicated by dashed lines (position 21) in FIG. 6.

When the frequency of the voltage applied between electrodes 4 and 8 is selected to match (or substantially match) the natural frequency of the HDP transformer 1, the composite structure will vibrate as illustrated in FIG. 6 (from position 20 to position 21). The HDP tends to resonate in such a manner to establish nodes as indicated at lines 22 in FIG. 6. If the shape of the HDP transformer were circular, as in the preferred embodiment of the invention, the node 22 would be established in a circular pattern in plan view, as illustrated in FIG. 5. Because the node 22 represents the position of minimum displacement of the vibrating HDP transformer 1, electrical leads 15 and 16 are preferably attached (for example by solder or conductive epoxy 18, or the like) at the node 22. Thus, the resonant frequency of the HPD transformer will depend upon the dimensions of the transformer. More specifically, in a circular disk-shaped transformer, the radial mode resonant frequency equals the thin disk's planar frequency constant $N_P$ (radial mode frequency constant) in the plane of the disk, divided by twice the disk's radius (2r). For a rectangular plate-shaped transformer, the longitudinal mode resonant frequency along an axis equals the longitudinal mode frequency constant $N_1$ divided by the length of the transformer along that longitudinal axis.

In the preferred embodiment of the invention the ceramic layer 5 on the "driver" side 1A of the transformer 1 is made of a "hard" ceramic material. "Hard" ceramics are desirable because they can withstand high levels of electrical excitation and mechanical stress and typically have high Q factors. Examples of "hard" ceramic materials include, but are not limited to: PZT-4 (DOD Type I) and PZT-8 (DOD Type III) as manufactured by Morgan Matroc Company; or APC-841 as manufactured by American Piezo Ceramics, Inc. By way of example, APC 841 has the following characteristics: 0.35% dissipation factor measured at C1 KC @ Low Field; 320 degree C. Curie Temperature; 0.033 to 0.067 coupling coefficient; 109 m/V to $450 \times 10^{-12}$ m/V piezoelectric coefficient; 10.5 to $35 \times 10^{-3}$ $m^2/C$ piezoelectric coefficient; 6.3 to $7.6 \times 10^{10}$ $N/m^2$ Young's Modulus; 2070 m/s longitudinal mode frequency constant; 1710 m/s thickness mode frequency constant; 2260 radial mode frequency constant; 11.7 to $17.3 \times 10^{12}$ $m^2/N$ elastic compliance; 7.6 g/cc density; and 1400 mechanical quality ("$Q_m$") factor.

In the preferred embodiment of the invention the ceramic layer 11 on the "driven" side 1B of the transformer 1 is made of a "soft" ceramic material. A "soft" ceramic is desirable on the driven side 1B of the transformer 1 because it offers relatively less resistance to being mechanically deformed than would a "hard" ceramic material. Examples of "soft" ceramic materials include, but are not limited to: PZT-5A (DOD Type II) and PZT-5B (DOD Type II) as manufactured by Morgan Matroc Company; or APC-850 as manufactured by American Piezo Ceramics, Inc. By way of example, APC 850 has the following characteristics: 1.4% dissipation factor measured at C1 KC @ Low Field; 360 degree C. Curie Temperature; 0.036 to 0.072 coupling coefficient; 175 m/V to $590 \times 10^{-12}$ m/V piezoelectric coefficient; 12.4 to $36 \times 10^{-3}$ $m^2/C$ piezoelectric coefficient; 5.4 to $6.3 \times 10^{10}$ $N/m^2$ Young's Modulus; 1900 m/s longitudinal mode frequency constant; 1530 m/s thickness mode frequency constant; 2030 radial mode frequency constant; 15.3 to $17.3 \times 10^{12}$ $m^2/N$ elastic compliance; 7.7 g/cc density; and 80 mechanical quality ("$Q_m$") factor.

It has been observed that when the HDP transformer 1 is electrically actuated as described above, causing "lamb" wave resonant frequency vibration of the composite device, it is possible to achieve deformation of ceramic layers 5 and 11 one or more orders of magnitude greater than would be possible by surface wave or planar piezoelectric deformation (such as typically may occur in prior "Rosen-type" piezoelectric transformers). When an input voltage across ceramic layer 5 causes ceramic layer 5 to piezoelectrically deform, it, in turn, mechanically causes ceramic layer 11 to deform, and such mechanically induced deformation of ceramic layer 11 piezoelectrically generates a second voltage across the electrodes 8 and 12 of ceramic layer 11. Because the achievable deformation is one or more orders of magnitude greater than is possible in prior Rosen-type transformers, the power transmission capacity of the described HDP transformer 1 is similarly one or more orders of magnitude greater than is possible in prior Rosen-type transformers of a similar size.

Below are described methods if using the HDP transformer 1 in a voltage converter circuit, particularly in a gas discharge (e.g. fluorescent lamp ballast application. In order to understand the operation of the HDP transformer in such applications, the performance characteristics of the disclosed HDP transformer 1 are first described.

Figure 8:
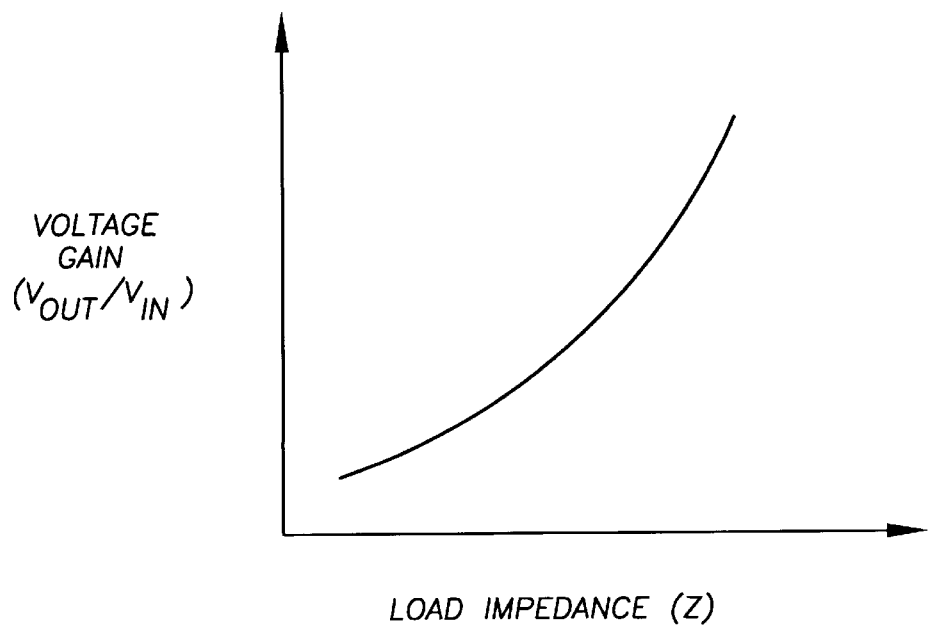
FIG. 8 is a graph plotting voltage gain versus load impedance of an exemplary multi-layer piezoelectric transformer that is preferably used in a voltage converter circuit constructed in accordance with the principles of the present invention.
Figure 9:
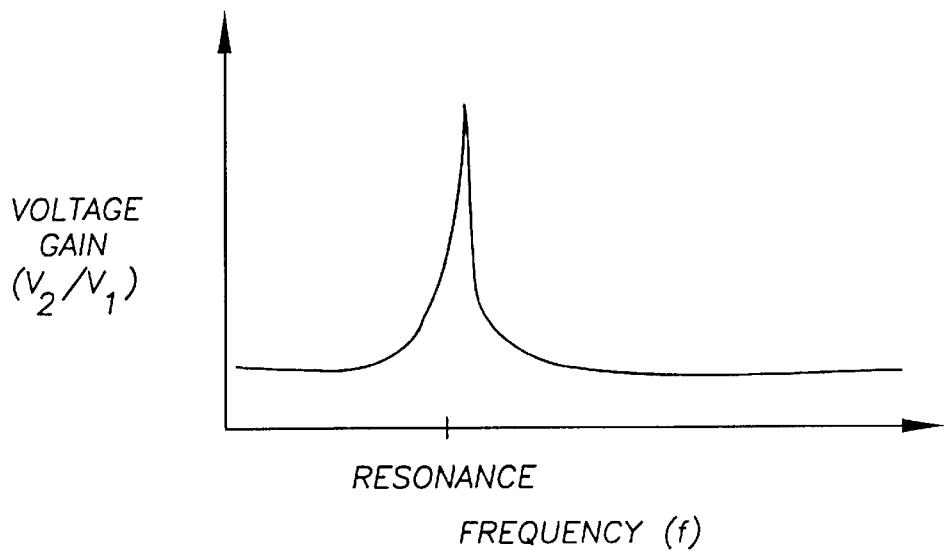
FIG. 9 is a graph plotting voltage gain versus frequency of an exemplary multi-layer piezoelectric transformer that is preferably used in a voltage converter circuit constructed in accordance with the principles of the present invention.

FIGS. 8–9 illustrate performance characteristics of the disclosed HDP transformer 1. FIG. 8 is a graph plotting voltage gain versus load impedance of an exemplary HDP transformer 1 used according to the principles of the present invention. As can be seen in FIG. 8, the voltage gain of the HDP transformer 1 increases with increasing load impedance. As used herein, "voltage gain" refers to the ratio of the voltage input (V1) across the electrodes of a first piezoelectric ceramic layer (e.g. ceramic layer 5) to the voltage output (V2) across the electrodes of a second ceramic layer (e.g. ceramic layer 11) of an HDP transformer. Thus it will be understood from a review of FIG. 8 that when the HDP transformer 1 is used in an electrical circuit in which a constant (albeit alternating or pulsed) first voltage is applied across the electrodes of the first ceramic layer (e.g. ceramic layer 5) and a load of variable impedance is applied across the electrodes of the second ceramic layer (e.g. ceramic layer 11), the voltage developed across the electrodes of the transformer 1 will automatically increase as the impedance of the load increases, and will automatically decrease as the impedance of the load decreases.

FIG. 9 is a graph plotting voltage gain versus frequency (at constant load impedance) of an exemplary symmetric HDP piezoelectric transformer 1 used in the preferred embodiment of the present invention. As described above, in the preferred embodiment of the invention the HDP transformer 1 is a multi-layer composite structure having a generally right cylindrical shape. Accordingly, it will be understood that the preferred embodiment of the HDP transformer 1 is symmetrical in at least one dimension. For such a symmetric HDP transformer the maximum voltage gain occurs at the natural (resonant) frequency of the device; and, as illustrated in FIG. 9, such relatively high voltage gain is achieved over a relatively narrow bandwidth (as indicated by the steepness of the curve near resonant frequency).

Figure 10:
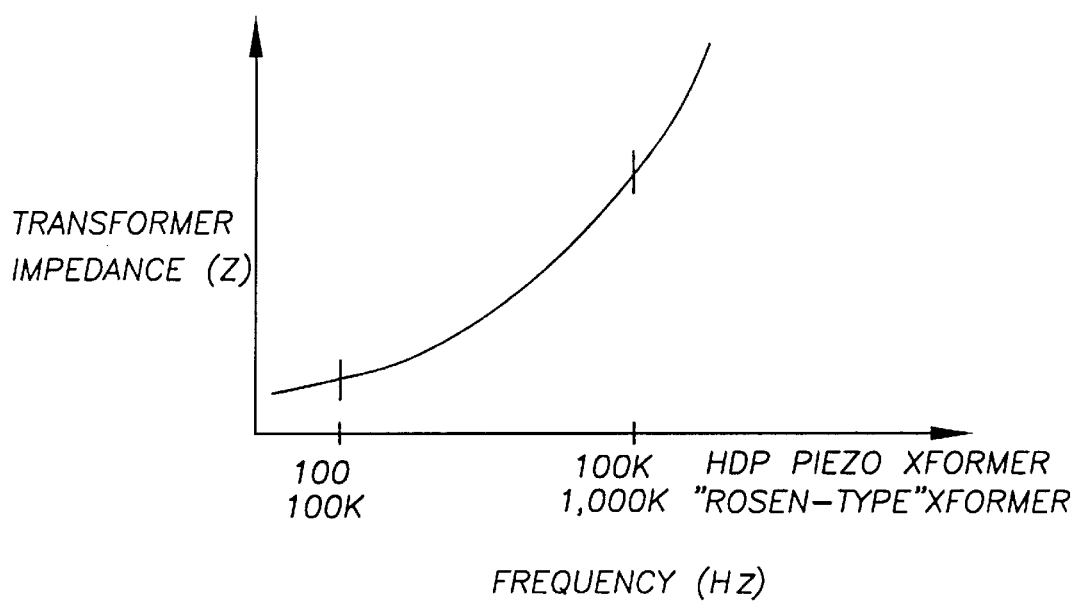
FIG. 10 is a graph comparing transformer impedance versus frequency of a typical prior Rosen-type transformer and an exemplary multi-layer piezoelectric transformer that is preferably used in a voltage converter circuit constructed in accordance with the principles of the present invention.
Figure 11:
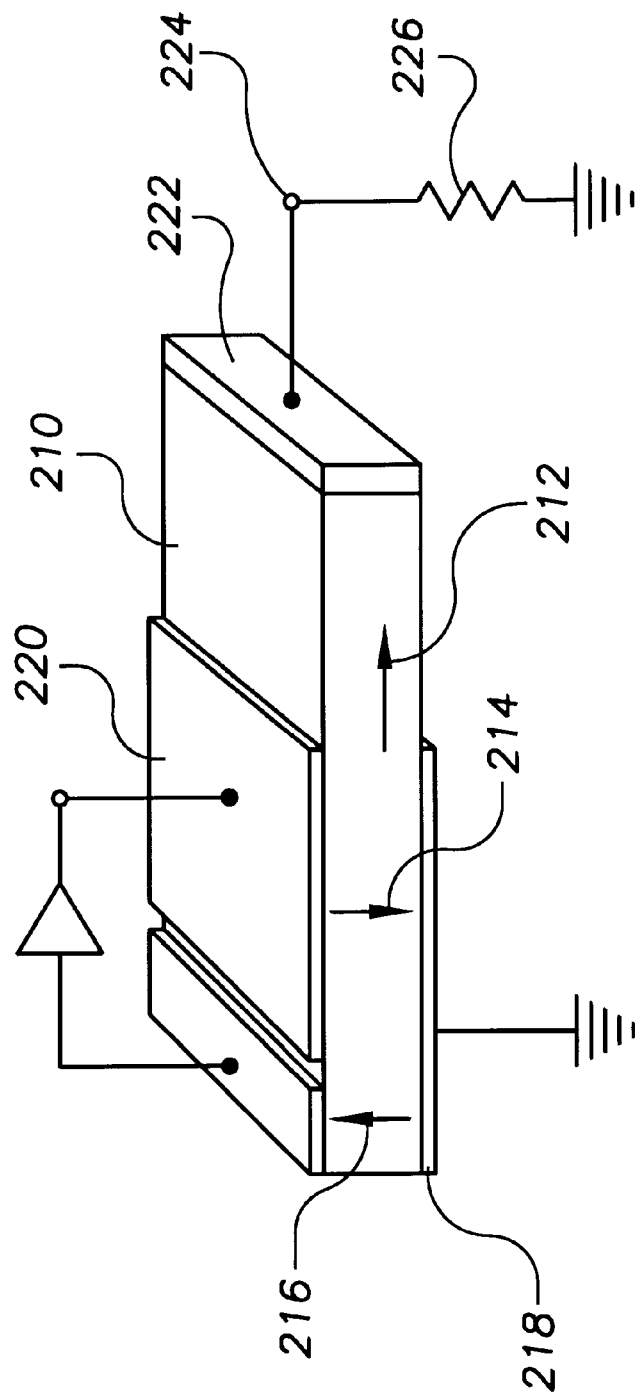
FIG. 11 is a perspective view showing a prior "Rosen-type" piezoelectric transformer that may be used in accordance with an embodiment of a voltage converter circuit constructed in accordance with the principles of the present invention of the present invention.

FIG. 10 is a graph comparing internal transformer impedance versus input voltage frequency for an exemplary HDP piezoelectric transformer 1 used in the preferred embodiment of the present invention and a comparably-sized prior Rosen-type transformer. As illustrated in FIG. 10, the internal impedance of the typical HDP piezoelectric transformer (1), in the frequency range of 100 Hz to 100 kHz (i.e. the operating frequency range of common fluorescent lamp ballasts), is much greater than that of prior Rosen-type transformers of comparable size. Accordingly, it will be understood that designing of circuitry using HDP transformer 1 can be simpler than designing of circuitry using prior Rosen-type transformers, because it is much easier to match (and maintain a match of) the impedance of the HDP transformer 1 than to match (and maintain a match of) the impedance of common prior Rosen-type transformers, which is more vulnerable to slight impedance variations.

DC-AC Voltage Converter Circuit

Figure 2:
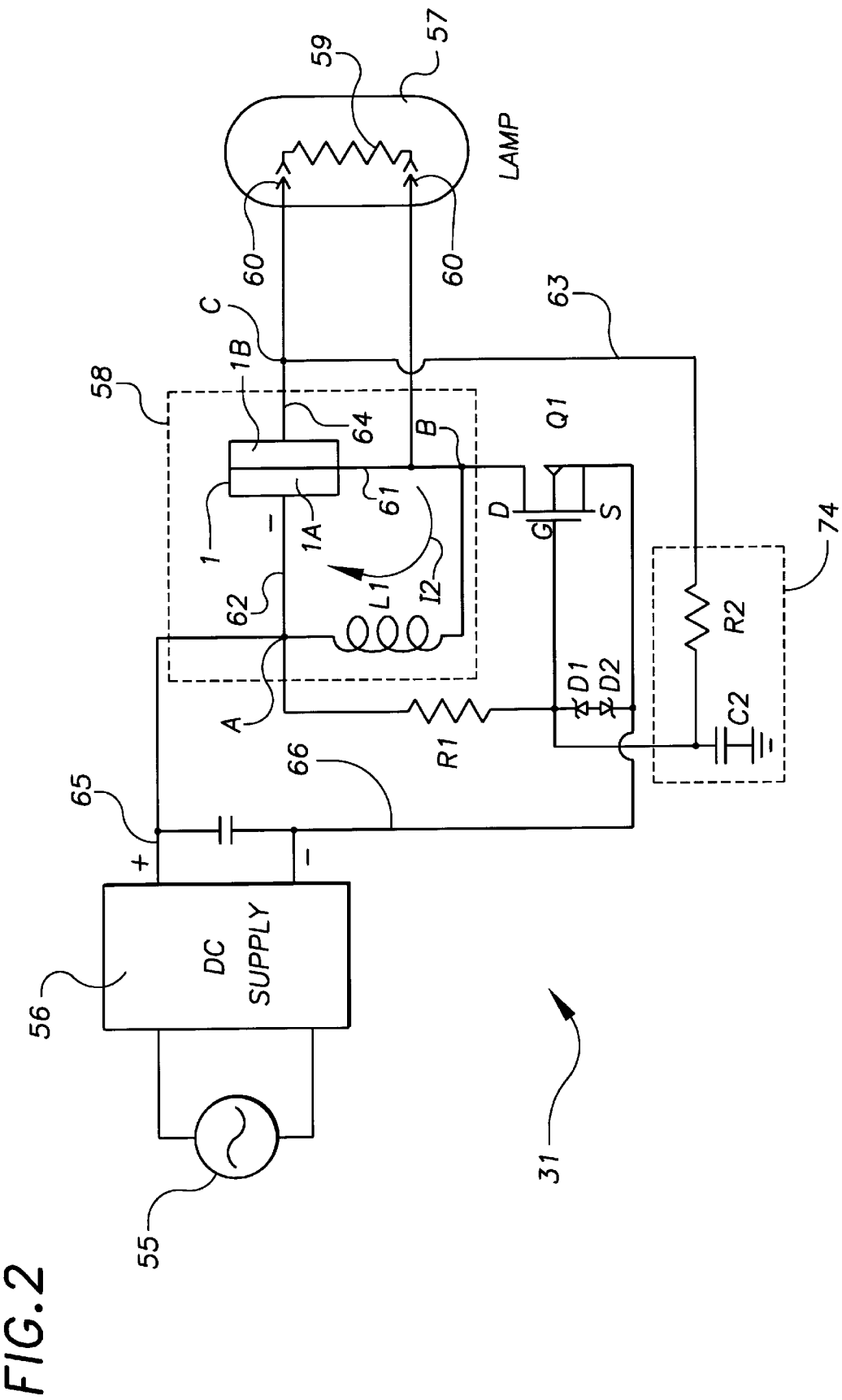
FIG. 2 a schematic diagram of the voltage converter circuit of FIG. 1, showing resonant circuit current flow in an opposite direction.

Referring now to FIGS. 1 and 2: FIG. 1 is a schematic diagram of one exemplary embodiment of a voltage converter circuit that incorporates principles of the present invention. In order to explain how a voltage converter circuit configured in accordance with the present invention may be used, FIG. 1 illustrates, and the following disclosure describes, an exemplary application of the present the converter circuit wherein the "load" is a gas discharge lamp such as a fluorescent lamp. However, as will be appreciated by those skilled in the art, a voltage converter circuit constructed in accordance with the present invention can be used in a wide range of applications and with a wide range of "loads".

It will be understood that the HDP transformer 1 that is referred to in the circuit illustrated in FIG. 1 and the corresponding Specification is preferably the HDP transformer 1 that is described in detail herein above and illustrated in FIGS. 3–10. However, as will become apparent to those of skill in the art, the principles of the present voltage converter circuit invention may be advantageously applied to other, conventional, piezoelectric transformers.

The preferred embodiment of the voltage converter circuit is generally indicated in FIG. 1 by the reference number 2. In the preferred embodiment of the invention, relatively low voltage, low frequency electrical power is converted to a high frequency voltage in order to operate a fluorescent lamp 57. In operation, the circuit 31 provides a high voltage potential across the cathodes 60 of an initially turned-off lamp 57 until the lamp fires. After the lamp 57 fires, voltage between the cathodes 60 is advantageously reduced to a level sufficient to keep the fluorescent lamp 57 burning. As will be discussed below, circuitry is provided to convert the power from the power supply 56 to a voltage and frequency corresponding to the operation requirements of the lamp 57.

Firing of Lamp

The circuit 31 is preferably powered by a DC power supply 56. The DC power supply may comprise one or more batteries or may, alternatively, be driven by a 60 VAC power source 55. In the example illustrated in FIG. 1, the output from the DC supply 56 is preferably +/–85 volts. A capacitor Cl may be provided between the positive 65 and negative 66 output terminals of the DC supply 56.

The positive voltage output 65 from the DC supply 56 is connected (at junction A) to electrical conductor 62, which is connected to the input side 1A of the transformer 1. Resistor R1, which is in parallel with the input side 1 A of the transformer, is connected in series between junction A and the gate (G) of FET Q1. When the circuit 31 is first turned on, the voltage of the gate (G) of FET Q1 is pulled up by resistor R1, which is of relatively high value, and this causes FET Q1 to turn on.

When FET Q1 is turned on, current begins to flow through the inductor L1, which is connected at one end to junction A and at the other end to junction B. At the same time, the voltage at junction B is pulled low. Junction B is also connected via conductor 61 to the center electrode (8) of the transformer and to the drain (D) of FET Q1.

With FET Q1 turned on, current begins to flow (from junction A towards junction B, as indicated by arrow I1) through inductor L1. The voltage at junction B thus being pulled low causes the input (primary) side 1A of the HDP transformer 1 to begin to charge. The charging of the input side 1a of the HDP transformer 1 causes the conductor 62 at the input side 1A of the HDP transformer to acquire a positive charge while and the conductor 61 to the center electrode (8) of the HDP transformer 1 is near ground. An electric field is thus established between the conductor 62 at the input side 1A of the transformer 1 and the conductor 61 at the center (i.e. "ground") electrode of the transformer.

The cathodes 60 of the fluorescent lamp 57 are connected via electrical conductor 64 to the output side 1B of the HDP transformer and via electrical conductor 61 to the center ("ground") electrode of the transformer, as illustrated in FIG. 1. Conductor 63, which is connected to conductor 64 at junction C, communicates the signal from the output side 1B of the transformer to the gate (G) of FET Q1.

The HDP transformer 1 is vibrated (by electrical excitation of the piezoelectric layer (5) on the "primary" side 1A of the transformer) in order to generate voltage at the "secondary" side 1B of the transformer. This voltage at the secondary side 1B of the transformer is applied to one of the cathodes of the lamp 57. Soon after energizing the circuit, (e.g., after the first 1–3 cycles), the voltage at the secondary side 1B of the transformer becomes high enough to fire the lamp. This may take a few micro-seconds, in order for the HDP transformer 1 to vibrate back and forth enough times for the amplitude of the vibrations (and, therefore, the voltage generated) to build up to a sufficiently high value to fire the lamp.

As the HDP transformer 1 flexes (in response to, say, a positive first voltage potential between conductors 62 and 61 across the "driver" side 1A of the transformer) during one half cycle, it generates a negative second voltage between conductors 61 and 64 at the output (i.e. "driven") side 1B of the transformer. This voltage is fed back (via conductor 63) to the gate (G) of FET Q1 and, in turn, causes FET Q1 to turn off. When FET Q1 turns off, the magnetic field in inductor L1 begins to collapse. This (i.e. the collapse of the magnetic field) causes the current to continue flowing. The positive charge that has built up on the input side 1A of the HDP transformer 1, flows out of the HDP transformer 1, through the inductor L1 and into the "grounded" side of the inductor L1, as indicated in FIG. 1 by arrow I1.

As the magnetic field around inductor L1 continues to collapse, the HDP transformer 1 now flexes back in the opposite direction, and the HDP transformer 1 begins to accumulate negative charge at the input side 1A of the HDP transformer. Since the HDP transformer is now flexing in the opposite direction, FET Q1 will now turn on. When FET Q1 turns back on, a similar situation exists as before. The charge is taken out of the "ground" conductor 61 connected to the center electrode of the HDP transformer 1 and then current flow (indicated by arrow I2 in FIG. 2) increases in the inductor L1.

The described cycle keeps repeating so that, as the HDP transformer 1 output voltage changes polarity, the gate of FET Q1 turns on and off in synchronization with the tuning of the circuit. After a few cycles of operation, the voltage at the output 1B of the HDP transformer (and, therefore, the voltage in conductor 64) rises high enough to fire the lamp 57.

Lamp Operation after Firing

After the lamp 57 fires, the lamp impedance drops, which causes the voltage gain of the HDP transformer 1 to correspondingly change (i.e. drop), and the voltage applied to the lamp will thereby advantageously drop also.

In the circuit illustrated in FIG. 1, the output of a HDP transformer 1 is used to drive high frequency voltage directly to a fluorescent lamp 57. As will be discussed more fully below, the HDP transformer advantageously vibrates at or near its natural frequency, and in so doing produces an electrical signal of substantially constant high frequency, but at a voltage that automatically advantageously varies according to whether the lamp has been fired. Also, as will discussed more fully below, the disclosed circuit permits the generation of higher transformer output voltage than would otherwise be possible, by recovering and advantageously applying otherwise unused energy that is temporarily stored during each half-cycle of operation.

As discussed above, the HDP transformer 1 converts electrical energy into mechanical energy; and the mechanical energy is then converted back into electrical energy. The magnitude of that mechanical energy determines, to some extent, the voltage gain of the device. Under "no-load" conditions the HDP transformer is typically capable of achieving more oscillatory motion (i.e. greater amplitude at a given frequency) than in "high-load" conditions. This is inherently so because when no charge is removed from the output (i.e. driven) side 1B of the transformer (as would typically occur if the output were connected to a low impedance load) it is capable of moving more freely than it would if the charge were removed. Thus, when the transformer 1 oscillates freely it generates a greater voltage gain than when its movement is restricted. This greater voltage gain under no-load (or low-load) conditions is taken advantage of in the present circuit by the transformer's 1 automatically applying greater voltage to the load (i.e. to the lamp) when there is no, or low, load (e.g., when the lamp is initially turned on).

Prior to the lamp's being fired it presents very little load to the HDP transformer 1. This small load results from a very slight parasitic capacitance load. Under this condition, the voltage gain, and therefore the voltage output, of the HDP transformer 1 is relatively high. Since the voltage output of the HDP transformer 1 is high, the voltage initially applied to the lamp is high. Because the transformer 1 generates a high voltage output under no-load conditions, it is possible to fire the lamp in "cold cathode" mode using this circuit (rather than, for example, preheating the cathodes before firing the lamp).

When the lamp fires, the filament 59 of the lamp 57 cools down, which lowers the resistance of the lamp (to about 400 OHM). At lower resistance, the lamp 57 begins drawing more current. This current is the moving charge that is removed from the secondary side 1B of the HDP transformer 1. As the electrical field at the secondary side 1B of the HDP transformer 1 decreases, the deflection of ceramic layer 11 automatically reduces. This reduces the amplitude of the movement/oscillation of the HDP transformer 1, which reduces the voltage gain of the device. Accordingly, it will be understood that the HDP transformer 1 provides a variable transformer output voltage that depends on the impedance of the load, such that the gain of the device is high for light loads and the gain of the device is low for high loads.

In prior (e.g. wire wound electromagnetic) transformers used in lighting ballast circuits, the transformer typically has a fixed output impedance and, for maximum power transfer, it is necessary to have a low impedance load matched to that output impedance. For such prior circuits, at any other (i.e. unmatched) impedance it is not possible to achieve maximum power transfer, and, accordingly, the efficiency of such ballasts decreases. In addition, in such prior transformers the voltage gain depends predominantly on the ratio of the turns of the coils (a fixed number) and the frequency of the input signal.

Since an HDP transformer 1 constructed in accordance with the present invention has variable voltage gain and because the voltage gain changes with the load, there is a relatively wide range of load resistances at which it can achieve very high efficiency. This characteristic enables the present circuit to fire the lamp and then automatically match the lamp's impedance after the lamp 57 begins running.

It will be understood from the above disclosure that HDP transformer 1 may be advantageously used in connection with an electrical circuit pursuant to the principles described herein above to provide a fluorescent lamp excitation and control circuit that can be made smaller and simpler than conventional circuits using magnetic step-up transformers or prior piezoelectric transformers. Significantly, such an electrical circuit may readily be constructed small enough to easily fit into a standard "Edison base", thus enabling the construction of compact fluorescent lamps that fit into standard incandescent lamp fixtures.

It will further be understood that in the above described application of the invention a DC first voltage (i.e. output from DC supply 54) is converted to an AC second voltage (i.e. at the output conductor 64 from transformer 1), wherein the second voltage (i.e. at the output conductor 64 from transformer 1) is higher than the first voltage (i.e. at the output from DC supply 54), and wherein the second voltage (i.e. at the output conductor 64 from transformer 1) is at a frequency corresponding to the natural (i.e. resonant) frequency of the transformer 1. Thus, the present invention provides an "inverter" circuit for efficiently converting a first (DC) voltage to a second (AC) voltage.

It will still further be understood that in the above described application, an AC first voltage (i.e. the output from the 60 Hz power supply 55) is converted to an AC second voltage (i.e. at the output conductor 64 from transformer 1), wherein the second voltage (i.e. at the output conductor 64 from transformer 1) is higher than the first voltage (i.e. at the output from AC power supply 54), and wherein the second voltage (i.e. at the output conductor 64 from transformer 1) is at a higher frequency than that of the first voltage (i.e. the output from the 60 Hz power supply 55). Thus, the present invention provides a circuit for efficiently converting a first (AC) voltage at a first frequency to a second AC voltage at a second frequency.

As stated previously, in the above described application of the invention an AC first voltage (i.e. the output from the 60 Hz power supply 55) is converted to an AC second voltage (i.e. at the output conductor 64 from transformer 1), wherein the second voltage (i.e. at the output conductor 64 from transformer 1) is higher than the first voltage (i.e. at the output from AC power supply 54), and wherein the second voltage (i.e. at the output conductor 64 from transformer 1) is at a higher frequency than that of the first voltage (i.e. the output from the 60 Hz power supply 55). Since the frequency of the voltage at the output conductor 64 from transformer 1 depends only (or predominantly) upon the natural physical frequency of the transformer 1, the frequency of the second voltage (i.e., at the output conductor 64 from transformer 1) is substantially independent of the frequency of the first voltage (i.e., the output from the 60 Hz power supply 55). Furthermore, by advantageously selecting a transformer 1 having a very high natural (vibrational) frequency the output 64 from the transformer 1 can be chosen to be very high. It will be understood, then, that by rectifying (e.g., by diode array) and then filtering (e.g., by a capacitor element) the (high frequency) output 64 from the transformer 1, a modification of the disclosed circuit can also be used to convert a first DC voltage to a second DC voltage.

In addition, it will be understood from the above disclosure that an HDP transformer 1 constructed in accordance with the present invention may be used in conjunction with an electrical circuit pursuant to the principles described herein above to provide a fluorescent lamp excitation circuit that does not require a sinusoidal input in order to generate a high-frequency, high-voltage, AC transformer output.

As discussed above, the HDP transformer 1 that is used in the preferred embodiment of the invention, (i.e. in a gas fluorescent lamp ballast circuit application) is preferably circular in shape. The reason circular shape is preferred relates to the degrees of freedom of the device. A circular (or disc) shape HDP transformer has only a limited number of modes at which it can vibrate. By way of comparison, a square is not geometrically uniform about any point. A rectangle is even less uniform, and, therefore, can vibrate in several different modes. It will be appreciated then, that the power transmission capability of the HDP transformer depends on the efficiency by which it transfers mechanical (i.e. vibration) energy from one ceramic layer to the other. The more modes of vibration, the less efficiently that energy is transmitted.

The HDP transformer vibrates in either the fundamental mode of vibration or harmonics of same. Dissipation within the ceramic is directly related to the operation frequency. Therefore, when the frequency of vibration increases, heat generation and dissipation within the ceramic increases. So, if the device is operating at a harmonic (rather than the fundamental) mode, any part of the ceramic may be vibrating and the amount of power dissipation will be relatively higher.

Accordingly, in the preferred embodiment of the invention (wherein high power transmission efficiency is desirable) it is desirable that a symmetric (i.e. circular) HDP transformer be used. However, in certain other applications (for example in wide bandwidth signal transmission) wherein constancy of voltage gain over a wide signal input frequency range is desirable, it is preferable that the HDP transformer be asymmetrically shaped.

As discussed above, in the preferred embodiment of the invention the HDP transformer comprises a first ceramic disc and a second ceramic disc that are bonded together with an intermediate electrode 8 (preferably copper) layer therebetween. In the preferred method of manufacturing the HDP transformer the ceramic discs 5 and 11 have electro-deposited electrodes 4, 6, 10 and 12 on their major planar faces. In addition, supplemental copper electrodes 2 and 14 are bonded to the opposite outboard planar surfaces of the bonded ceramic layers. The supplemental electrode layers 2 and 14 provide good mechanical and electrical connection between the wire leads and the electro-deposited electrodes 4 and 12. However, it is within the scope of the invention to provide a modification of the HDP transformer that is manufactured without one or more of the supplemental electrodes 2 and 14. In addition, the supplemental electrodes 2 and 4 and the intermediate electrode 8 can be made of conductive materials other than copper.

In the preferred embodiment of the invention the various described layers are bonded together with "Cibageigy AV118" epoxy. During manufacture of the HDP transformer 1 the composite layers of the transformer are clamped together and heated to a temperature of at least 121 degrees C., which is the activation temperature of the epoxy. In order to accelerate the curing process the temperature may be advantageously raised to 150–175 degrees C., well below the curie temperature of the ceramic layers of the device. The "Cibageigy AV118" epoxy is preferred because it provides a strong bond between the layers of the HDP transformer and can be cured at a temperature below the curie temperature of the ceramic layers. However, other methods of bonding the various layers (i.e. the ceramic and electrode layers) of the device together may be used, including other epoxies (both conductive and non-conductive), ultrasonic welding, polyimide adhesives, eutectic bonding and cofiring.

In the preferred embodiment of the HDP transformer the ceramic layers are made of a very hard piezoelectric ceramic material, for example ceramic #841 as manufactured and sold commercially by American Piezo Ceramics, Inc. of Mackeyville, Pa. The ceramic material preferably has a high deflection per volt, a high curing temperature, does not "depole" very easily, and is hard. A material having these attributes will typically have a high "Q" rating (i.e. the power per cycle in the device divided by the power per cycle that is needed maintain the device at that power level must be high). The Q-rating of the ceramic used in the preferred embodiment of the invention is 1400.

In the fluorescent lamp excitation circuits described herein above, the HDP transformer is between ½" and 1" diameter and resonates at a frequency between 85 and 150 kHz. By way of example, a ¾" diameter HDP transformer constructed in accordance with the present invention nominally operates (i.e. resonates) at a frequency of 125 kHz. The operating frequency of the HDP transformer depends, in part, on the relationship between the thicknesses of the ceramic layers 5 and 11 on the input and output sides, respectively, of the transformer. In the preferred embodiment of the invention, the thickness of the ceramic layer 5 on the input side of the transformer is in the range of 0.030 to 0.100 inches; and the thickness of the ceramic layer 11 on the output side of the transformer is in the range of 0.090 to 0.100 inches. If the output-side ceramic (11) is too thin then the voltage gain will be too low for use in the preferred circuit application. Generally, the input-ceramic (5) thickness is preferably somewhat thinner than the thickness of the output ceramic layer (11), which condition provides a better wave form (as described above) and less energy dissipation within the ceramic layers themselves.

In the preferred embodiment of the invention the HDP transformer 1 achieves sufficiently high voltage output (i.e. at conductor 64) to "cold fire" the lamp 57. However, the disclosed circuit may be modified using conventional electrical sub-circuitry (not shown) to pre-heat the cathodes 60 of the lamp.

Back-to-back zener diodes D1 and D2 are located between the gate (G) and source (S) of FET Q1, as illustrated in FIGS. 1 and 2 to clamp the voltage at the gate of the FET.

An R-C phase adjustment sub-circuit 64, comprising circuit components resistor R2 and capacitor C2, may be advantageously inserted into the feedback line (conductor 63), as illustrated in FIGS. 1 and 2 in order to optimize the efficiency of the voltage converter circuit. The HDP transformer 1 output signal (conductor 64) normally lags the input driving signal (conductor 62) by 90 degrees at resonance. The input side 1A of HDP transformer 1 has a real capacitance. At resonance it also has a large imaginary (i.e. "mechanical") capacitance and inductance (corresponding to the mechanical inertia of the flexing transformer). These are also present in the output side 1B of the HDP transformer 1. There exists a lag in the signal from the input side 1A to the output 1B side of the transformer. This lag may be adjusted up to 90 degrees according to the values of the R-C phase adjustment components (R2 and C2) selected.

It will be understood that the gate (G) of FET Q1 is responsive to voltage rather than current. Thus, the polarity of the HDP transformer 1 output may be advantageously oriented, using proper phase adjustment 64 in the feedback circuitry (i.e. conductor 63), to cause FET Q1 to switch when the voltage at the gate (G) to FET Q1 is at (or nearly at) zero. In this manner (i.e. by switching FET Q1 at the zero voltage point), very high operational efficiency can be achieved, since the power dissipated by FET Q1 is zero when the voltage is zero.

It will be understood that a parallel resonant circuit 58 is established wherein opposite ends of inductor L1 are electrically connected to the electrodes opposite opposing faces of the piezoelectric layer (5) of the driver side 1A of the transformer. In accordance with operation of the preferred embodiment of the invention, during one half-cycle of operation voltage of a first polarity is applied across the opposing electroded faces of the driver-side piezoelectric layer, which causes it to deform in a first direction. This deformation causes the second piezoelectric layer (11) to correspondingly deform. A finite amount of electrical energy is required to cause this deformation of the composite HDP transformer structure. The described deformation of the second piezoelectric layer (11) results in the piezoelectric generation of electrical energy (in the form of a voltage potential between the electrodes of the piezoelectric layer (11)) at the driven side 1B of the transformer. The electrical energy generated at the driven side 1B of the transformer can be advantageously applied to a load (such as the fluorescent lamp 57 in the example described above).

The electrical energy generated at the driven side 1B of the transformer ("output electrical energy") is inherently less than the amount of electrical energy that is initially applied to the driver side 1A of the transformer ("input electrical energy") in order to cause the described deformation. As will be appreciated by those skilled in the art, in prior voltage converter circuits comprising piezoelectric transformers, the difference between the magnitude of the output electrical energy and the input electrical energy was an approximate (albeit low) measure of the inefficiency of such transformer circuits because, in such prior circuits, the differential energy was largely (and in some cases totally) lost (i.e. dissipated as heat from the transformer). In a voltage converter circuit constructed and operated in accordance with the present invention, a portion of the input electrical energy is stored as piezoelectrically generated electrical potential energy (i.e. as a voltage charge) at the electrodes of the driver side piezoelectric layer 5 and a portion of the input electrical energy is stored as mechanical potential energy (i.e. by flexure of the composite structure within its elastic limit)—in addition to the portion of the input energy that converted to output electrical energy at the driven side 1B of the transformer. As the (composite structure of the) transformer flexes in the opposite direction during the second half-cycle of operation, the stored potential energy is converted to kinetic (electrical) energy in the form of current flowing in the opposite direction from the driver side 1A through the parallel resonant circuit 58. Inductor L1 alternately stores and releases electrical energy in coordination with the flexing of the transformer. The energy released from inductor L1 is advantageously used to supplement current from DC supply 56 to provide input electrical energy to drive transformer 1. It will therefore be understood that, in the above described manner, the amount of electrical energy from DC supply 56 that is required to produce a given amount of useable output electrical energy at the driven side 1B of the transformer is reduced relative to prior voltage converter circuits.

Isolated Converter Circuit Modification

Figure 12:
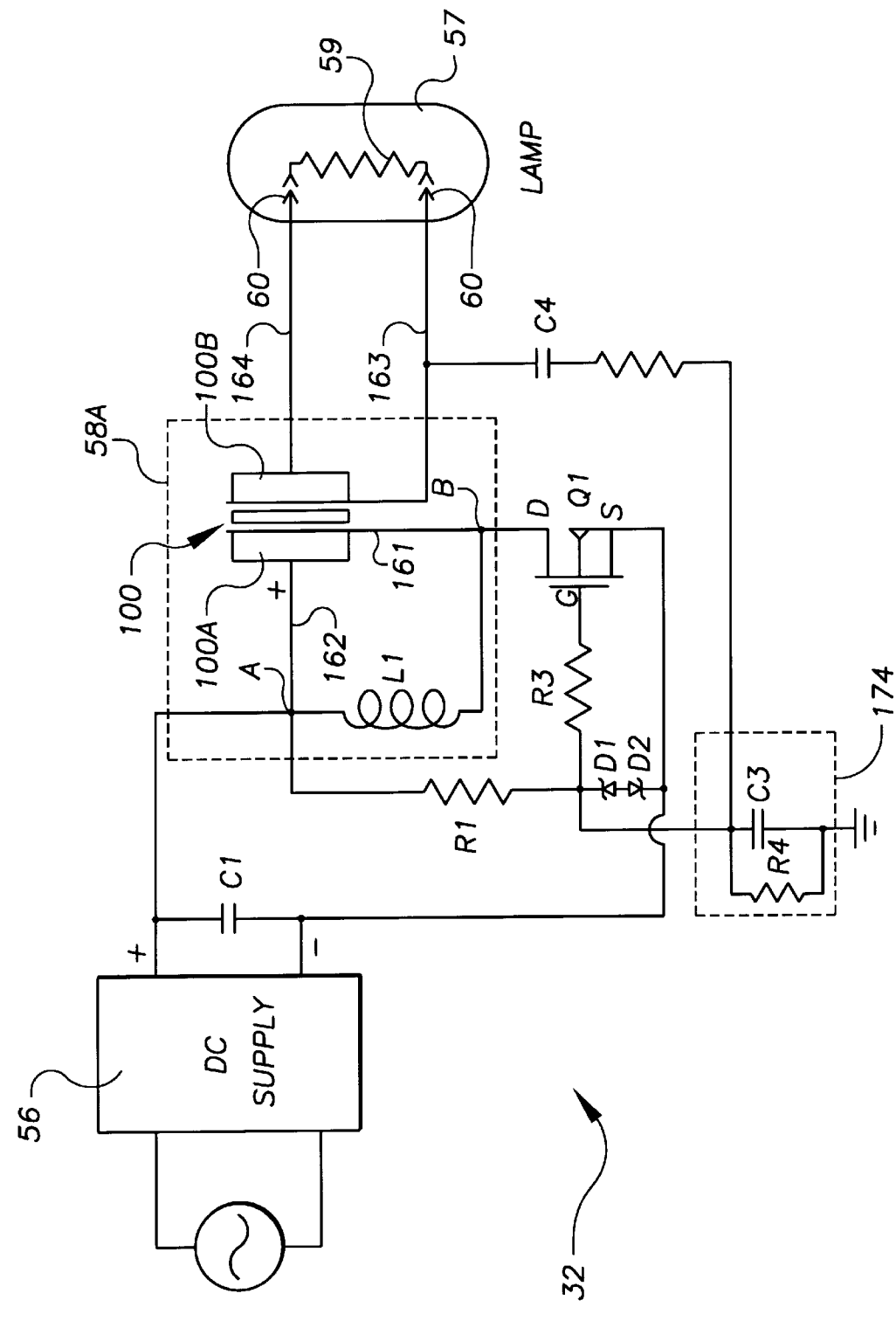
FIG. 12 a schematic diagram of a modified embodiment of a voltage converter circuit that incorporates principles of the present invention.
Figure 13:
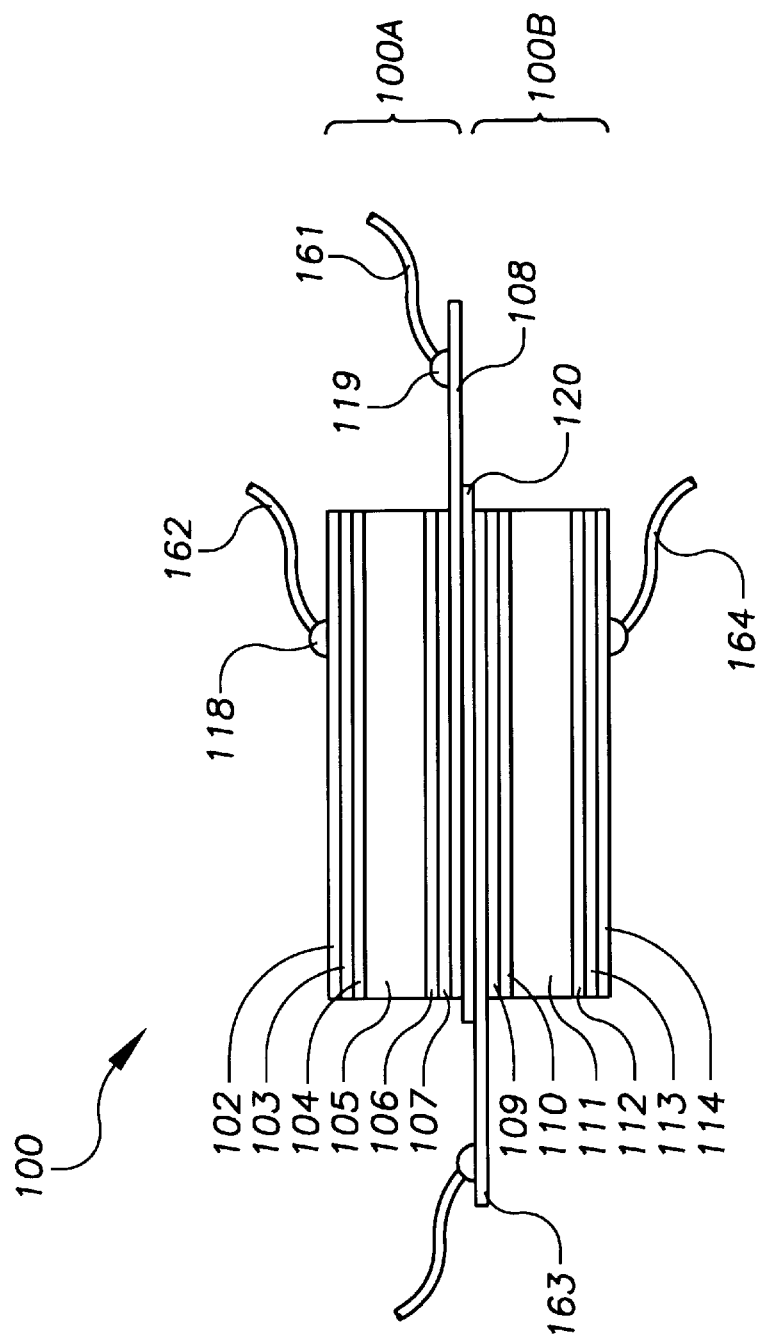
FIG. 13 is an elevation view showing a modified multi-layer piezoelectric transformer that may be used in the voltage converter circuit shown in FIG. 12; and, FIG. 14 a schematic diagram of a modified embodiment of a voltage converter circuit that incorporates principles of the present invention.

Referring now to FIGS. 12–13: FIG. 13 illustrates an isolating HDP transformer 100 whose operation is substantially identical to that of the HDP transformers 1 and 1C (FIGS. 3–5 and FIG. 7, respectively), except that the driver side 100A of the device is electrically isolated from the driven side 100B of the device by an electrical insulator layer 120. The driver side 100A of the isolating HDP transformer 100 illustrated in FIG. 13 comprises a first metal layer 102 bonded by adhesive 103 to the electrode 104 on one face of a piezo-ceramic layer 105; and a second metal layer 108 bonded by adhesive 107 to the electrode 106 on the other face of the piezo-ceramic layer 105. The driven side 100B of the isolating HDP transformer 100 illustrated in FIG. 13 comprises a first metal layer 114 bonded by adhesive 113 to the electrode 112 on one face of a piezo-ceramic layer 111; and a second metal layer 163 bonded by adhesive 109 to the electrode 110 on the other face of the piezo-ceramic layer 111. The driver side 100A and the driven side 100B of the HDP transformer 100 are bonded together with insulator layer 120 disposed therebetween, as illustrated in FIG. 13. The two sides (100A and 100B) of the transformer 100 may be bonded to the insulator layer 120 by adhesive, ultrasonic welding, or other method.

A voltage converter circuit 32 that incorporates an isolating HDP transformer 100 is illustrated in FIG. 12. The voltage converter circuit 32 illustrated in FIG. 12 works in much the same fashion as the (non-isolating) voltage converter circuit 31 described above and illustrated in FIG. 1. However, in the isolating voltage converter circuit 2A, inductor L1, which is connected via conductors 161 and 162 in parallel to the driver side 100A of the transformer, is isolated from the lamp 57, which is connected to the driven side 100B of the transformer by conductors 163 and 164. Capacitor C4 may be disposed between the driven side 100B side of the transformer and the gate (G) of FET Q1 in order to provide additional electrical isolation between the voltage supply 56 and the load (i.e. lamp 57).

Modified Voltage Converter Circuit with Oscillator Sub-circuit

Figure 14:
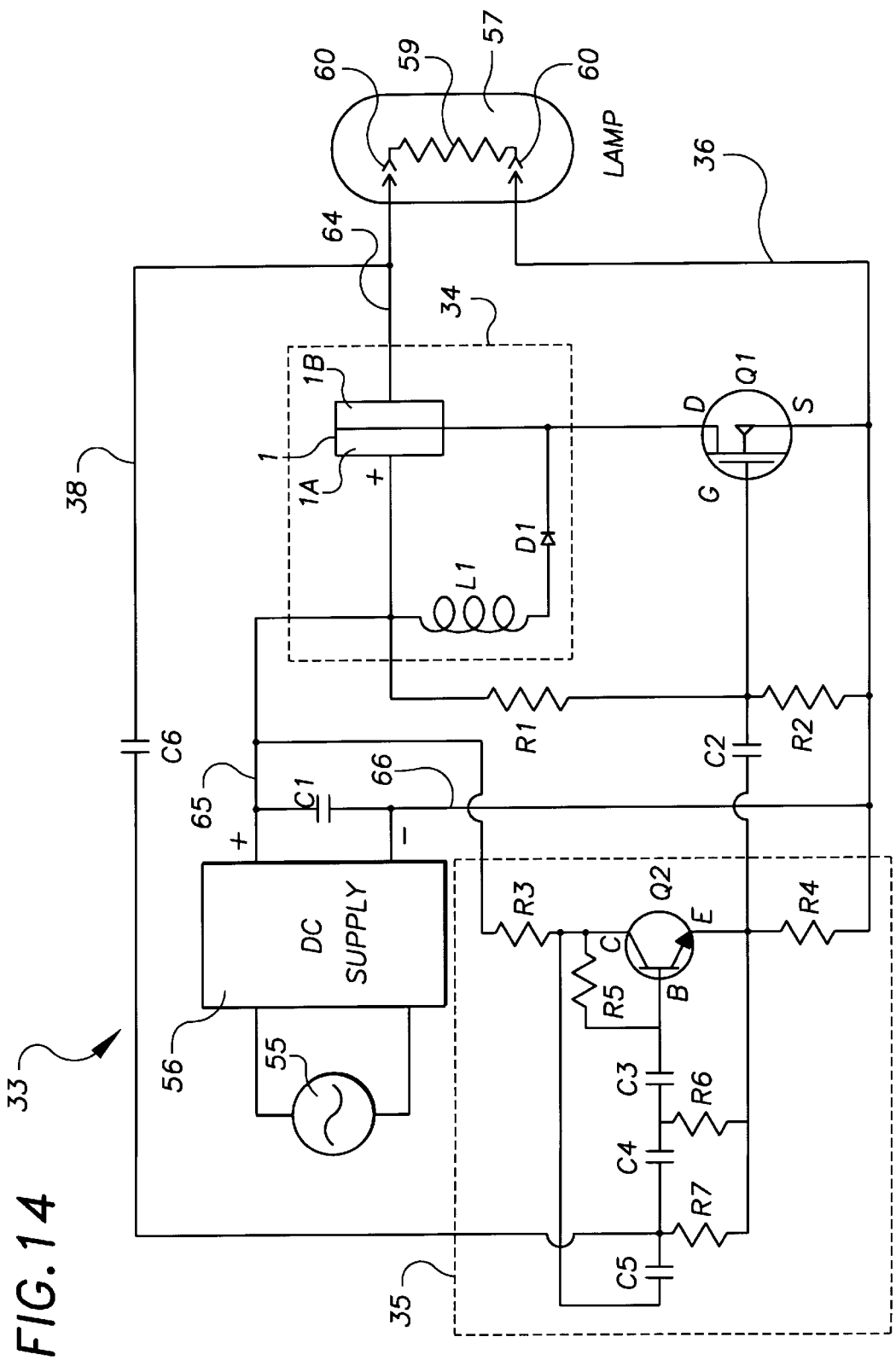

Referring now to FIG. 14: FIG. 14 illustrates a second modified voltage converter circuit 33 constructed and operated in accordance with the principles of the present invention. As with the above described preferred embodiment (illustrated in FIG. 1) and the above described first modified embodiment (illustrated in FIG. 12), circuitry is provided wherein a DC signal is applied to a resonating HDP transformer 1 to produce an AC signal at the output from the transformer.

In the above described exemplary applications of the invention (e.g. FIGS. 1 and 12) the AC signal at the output from the transformer is used to operate a gas discharge lamp 57. In the previously described embodiments of the invention (specifically circuits 31 and 32) a parallel resonant sub-circuit (58 or 58A) is provided between opposing electrodes of the input (i.e. driver) side of the HDP transformer; and feedback from the output side of the transformer is communicated to the gate (G) of switching transistor Q1 (via conductor 63).

In the second modified voltage converter circuit 33, a series resonant sub-circuit 34 (comprising inductor L1 in series with diode D1) is provided between opposing electrodes of the input (i.e. driver) side 1A of the HDP transformer; and feedback from the low voltage side of the load (i.e. lamp 57) is communicated to the gate of switching transistor Q1 (via conductor 36). In addition, in the second modified voltage converter circuit 33, a phase shift oscillator sub-circuit 35 provides a pulsed signal to the gate (G) of the switching transistor Q1.

It will be understood that the previously described preferred embodiment of the invention (illustrated in FIG. 1) and the previously described first modification of the invention (illustrated in FIG. 12) are "self resonating" circuits. The previously described "self resonating" circuits 31 and 32 largely rely on the initial pulse from turning on the DC power supply (for example by closing an on-off switch, not shown) to cause the transformer to begin resonating. Once the transformer begins resonating, the circuit operates as described above.

The second modified voltage converter circuit 33 is not a "self resonating" circuit; instead it has a phase shift oscillator sub-circuit 35 that provides small pulse signals to the gate (G) of the switching transistor Q1. The phase shift oscillator sub-circuit 35 generates small pulses that start the transformer 1 resonating when the circuit is initially turned on. The oscillator sub-circuit 35 preferably comprises three bypass capacitors C3, C4 and C5. Opposite ends of bypass capacitor C4 are connected to bypass capacitors C5 and C3. The opposite end of bypass capacitor C3 is connected to the base of phase shift transistor Q2. Biasing resistor R5 is connected between the base and collector of the phase shift transistor Q2. During the first several cycles of operation, the phase shift oscillator sub-circuit 35 provides small pulsed signals of sufficient voltage to turn FET Q1 off and on. After the circuit has operated for several cycles, the spring action of the transformer is sufficient to cause the parallel resonant circuit 34 to begin operating. When the parallel resonant circuit 34 is operating, energy required to flex the transformer 1 back and forth is alternately stored and released by the inductor L1 (i.e. in its magnetic field) and by the transformer itself (i.e. as mechanical spring energy), such that the amount of "new" energy that is provided during each cycle by the DC supply 56 to the input side 1A of transformer 1 is nearly equal to the energy drawn from the output side 1B of the transformer 1 by the load (i.e. lamp 57).

As with the preferred embodiment of the invention, once the lamp fires the impedance of the lamp 57 drops, which, in turn, causes the voltage gain of the transformer 1 to advantageously drop. Feedback is provided (via conductor 38 and parallel capacitor C6) from the output side output of transformer 1 to the phase shift oscillator 35, as illustrated in FIG. 14. During normal steady state operation of the second modified voltage converter circuit 33, the parallel resonant circuit 34 is maintained in tuned resonant operation by the phase shift sub-circuit 35 and R-C components capacitor C2 and resistor R2, which control the sequencing of opening and closing the gate (G) of FET Q1.

While the above description contains many specificities, these should not be construed as limitations on the scope of the invention, but rather as an exemplification of one preferred embodiment thereof. Many other variations are possible, for example:

While in the preferred embodiment of the invention the ceramic layers 5 and 11 are preferably constructed of a PZT ceramic material, other electroactive materials may be used in their place;

Circuits conforming to the principles of the described invention can be used to power other types lamps, including other gas discharge lamps, cold cathode fluorescent lamps and high intensity discharge lamps;

Multiple HDP transformers 1 can be connected in parallel to cumulatively transmit greater power to the lamp (or other driven device) than may be possible with one transformer alone;

While in the preferred embodiment of the invention both opposing major faces of each of the ceramic layers 5 and 11 of the HDP transformer 1 are pre-coated with electro-deposited electrodes, it is within the scope of the present invention to construct the HDP transformer from ceramic layers that have their outboard surfaces electroplated, provided that the transformer is constructed such that the center electrode 8 is either intimately in contact with each of the ceramic layers (e.g. such as by ultrasonic welding or cofiring) or an electrically conductive adhesive is used to bond the ceramic layers to the center electrode 8.

Other piezoelectric transformers, including Rosen-type transformers, may be used in place of the HDP transformer 1, in order to advantageously step up the voltage gain of such transformers;

"Soft" ceramic materials may alternatively be used for both (i.e. driver and driven) sides of the HDP transformer 1 in applications where lower power transmission capacity and lower power transmission efficiency are acceptable;

The phase adjustment circuit 74 can be replaced by phase adjustment circuit 174 (comprising resistor R4 and capacitor C3), or by other common phase adjustment circuitry;

"Hard" ceramic materials may alternatively be used for both (i.e. driver and driven) sides of the transformer;

Other switching devices, including common transistors, field effect transistors, "IGBT's", may be used to perform the switching operations of transistors (e.g., Q1 and Q2) illustrated in the accompanying schematic circuits; and, Other common phase adjustment sub-circuitry may be used in place of the phase adjustment sub-circuitry illustrated (74, 35);

Accordingly, the scope of the invention should be determined not by the embodiment illustrated, but by the appended claims and their legal equivalents.

What is claimed is:

1. A voltage converter circuit comprising:
    a resonant sub-circuit;
        said resonant sub-circuit comprising a transformer device;
            said transformer device having an input portion and output portion,
            said input portion comprising an electroactive layer disposed between a first electrode layer and a second electrode layer; and
            said output portion comprising a third electrode layer adjacent an electroactive layer;
        said resonant sub-circuit further comprising an inductor (L1) electrically connected in parallel with said input portion (1A) of said transformer device between said first electrode layer (4) and said second electrode layer (6);
    a first conductor adapted to be connected to a DC first voltage;
    a second conductor adapted to be connected to a DC second voltage, said DC first voltage being greater than said DC second voltage;
    said first conductor being electrically connected to said first electrode (4) and to a first end of said inductor (L1);
    a switching device (Q1),
        said switching device having a control input conductor (G), a first switch terminal (D) and a second switch terminal (S);

said first switch terminal (D) being electrically connected to said second electrode layer;

said second switch terminal (S) being electrically connected to said second conductor;

a first resistor (R1) in parallel with said inductor (L1), said first resistor being electrically connected at a first end to said inductor (L1) and said first conductor and said first electrode, and said first resistor being electrically connected at a second end to said control input conductor (G) of said switching device (Q1);

a second resistor (R2) in parallel with said switching device (Q1), said second resistor being electrically connected at a first end to said control input conductor (G) of said switching device (Q1), and said second resistor being electrically connected at a second end to said second terminal (S) of said switching device (Q1);

and a first output conductor connected to said third electrode;

whereby a DC voltage potential applied between said first conductor and said second conductor may be converted to an AC voltage potential between said first output conductor and second switch terminal (S).

2. The circuit according to claim 1, further comprising an oscillator sub-circuit, said oscillator sub-circuit comprising an oscillator switch (Q2), said oscillator switch having an oscillator switch first terminal (C) and an oscillator switch second terminal (E) and an oscillator switch input control conductor (B);

and further comprising a third resistor (R3) electrically connected at a first end to said first conductor (65) and at a second end to said oscillator switch first terminal (C);

a first capacitor (C2) electrically connected at a first end to said oscillator switch second terminal (E) and at a second end to said control input conductor (G) of said switching device (Q1);

and further comprising a feedback conductor electrically connecting said first output conductor with said oscillator switch input control conductor (B).

* * * * *